(12) United States Patent
Hauck

(10) Patent No.: US 8,149,084 B2
(45) Date of Patent: Apr. 3, 2012

(54) APPLIANCE REMOTE CONTROL APPARATUS AND METHOD OF USING SAME

(75) Inventor: Lane T. Hauck, San Diego, CA (US)

(73) Assignee: Lane T. Hauck, San Diego, CA (US)

( * ) Notice: Subject to any disclaimer, the term of this patent is extended or adjusted under 35 U.S.C. 154(b) by 1323 days.

(21) Appl. No.: 11/765,420

(22) Filed: Jun. 19, 2007

(65) Prior Publication Data

US 2008/0316371 A1 Dec. 25, 2008

(51) Int. Cl.
*G08B 21/00* (2006.01)
(52) U.S. Cl. ............... 340/4.11; 340/12.22; 340/12.23; 340/3.71; 398/114; 345/156; 341/176; 348/734
(58) Field of Classification Search ......... 340/4.11, 340/4.34, 4.42, 5.22, 12.22, 12.23, 12.28, 340/13.24, 13.31, 13.21, 3.7, 3.71; 341/175, 341/176; 398/114; 345/156, 157; 348/734
See application file for complete search history.

(56) References Cited

U.S. PATENT DOCUMENTS

| | | | | |
|---|---|---|---|---|
| 5,204,768 A * | 4/1993 | Tsakiris et al. | ............... | 398/107 |
| 5,408,275 A * | 4/1995 | Song et al. | ............... | 348/734 |
| 5,481,251 A * | 1/1996 | Buys et al. | ............... | 340/12.22 |
| 5,600,311 A * | 2/1997 | Rice et al. | ............... | 340/4.11 |
| 5,654,714 A * | 8/1997 | Takahashi et al. | ............... | 341/176 |
| 5,764,180 A * | 6/1998 | Cummings | ............... | 341/176 |
| 5,977,901 A * | 11/1999 | Fenner | ............... | 341/176 |
| 5,982,355 A * | 11/1999 | Jaeger et al. | ............... | 345/161 |
| 2004/0125080 A1* | 7/2004 | Ha et al. | ............... | 345/156 |
| 2008/0088471 A1* | 4/2008 | Trappler | ............... | 340/825.19 |

* cited by examiner

*Primary Examiner* — Benjamin C Lee
*Assistant Examiner* — Mark Rushing
(74) *Attorney, Agent, or Firm* — Bernard L. Kleinke; Duckor Spradling Metzger & Wynne

(57) ABSTRACT

A remote control apparatus and method of using are disclosed for controlling an electronic appliance such as a television set, radio, computer, or other. The remote control apparatus may include a hand held housing, a wireless transmitter for sending signals to the appliance, and a manually operated rotary controller for causing operation adjusting signals to be generated and supplied to the transmitter.

13 Claims, 8 Drawing Sheets

APPLIANCE REMOTE CONTROL APPARATUS AND METHOD OF USING SAME

BACKGROUND OF THE INVENTION

1. Field of the Invention

The present invention relates in general to an appliance remote control apparatus. It more particularly relates to a simplified apparatus and method for controlling remotely an electronic appliance, such as a television set, radio or other.

2. Background Art

There is no admission that the background art disclosed in this section legally constitutes prior art.

Remote controls are ubiquitous television set accessories. These hand-held units typically possess multiple buttons and features. For example, a television remote control may have in excess of 30 small pushbuttons plus a switch or set of pushbuttons that make all the buttons active either for the television set or a DVD player.

Unfortunately, there is a large segment of television users for whom the complexity of the television remote control may be overwhelming or at least difficult to use. For example, elderly television viewers may be confused by the complexity of the remote control to the point that they cannot readily determine how to turn on their television set, change the channel, or adjust the volume. In this regard, a remote control that has its TV/DVD switch inadvertently set to the "DVD" position may be rendered useless to a television user who does not understand the function of the switch. In this example, pressing the "channel up" button while "DVD" is selected may have no effect on the television set and therefore may well be a source of frustration to the operator. Such a switch may be easily inadvertently set to the "DVD" position by a user who is confused by the remote control and is trying all buttons and switches in an attempt to achieve certain desired basic operation.

As the number of buttons and choices has proliferated on television remote controls, the buttons have necessarily become small so that the remote control unit can be compact and easily held in the hand. Such a large number of small buttons may make reading and comprehending the functions of the many buttons difficult to discern for many users, especially elderly ones.

To make matters worse, an inspection of modern television sets reveals that only the most rudimentary functions may be controllable on the television set front panel, leaving the majority of the control options under exclusive control of the remote control unit. For the sake of styling, the television mounted controls may be so well integrated into the television faceplate that, in many instances, they may be difficult to see and operate by elderly users and others. For example, the "Volume Up" button may be the same color as the surrounding bezel, making it difficult to see. An immobile user may rely on the remote control for physical reasons since it may be difficult for such a user, who may be bedridden or in a wheelchair, to move to the television set.

Simplified television remote controls are known. In one type, exemplified by the Zenith/Magnavox "6 Button Simple TV Remote", the number of buttons is reduced to six. This reduces the button choices, but it does not differentiate the control appearances by function in any obvious and intuitive way, or in a manner that may be immediately familiar to a person, such as an elderly user or others. The Zenith/Magnavox unit contains a pre-stored data base of remote control codes sorted by television brand and model number, one of which must be selected by some preparatory procedure. A common problem with these "universal" remotes is that they may not internally contain all possible codes, perhaps omitting the one which the user may desire.

Another example, the "Oversized TV Remote Control" simply makes the entire unit larger in size, allowing for larger buttons. Such a unit contains a complex array of buttons, and it does not differentiate control types by their functions or reduce the choices to reduce confusion by the user.

BRIEF DESCRIPTION OF THE DRAWINGS

The features of this invention and the manner of attaining them will become apparent, and the invention itself will be best understood by reference to the following description of certain embodiments of the invention taken in conjunction with the accompanying drawings, wherein.

DESCRIPTION OF CERTAIN EMBODIMENTS OF THE INVENTION

Figure 1:
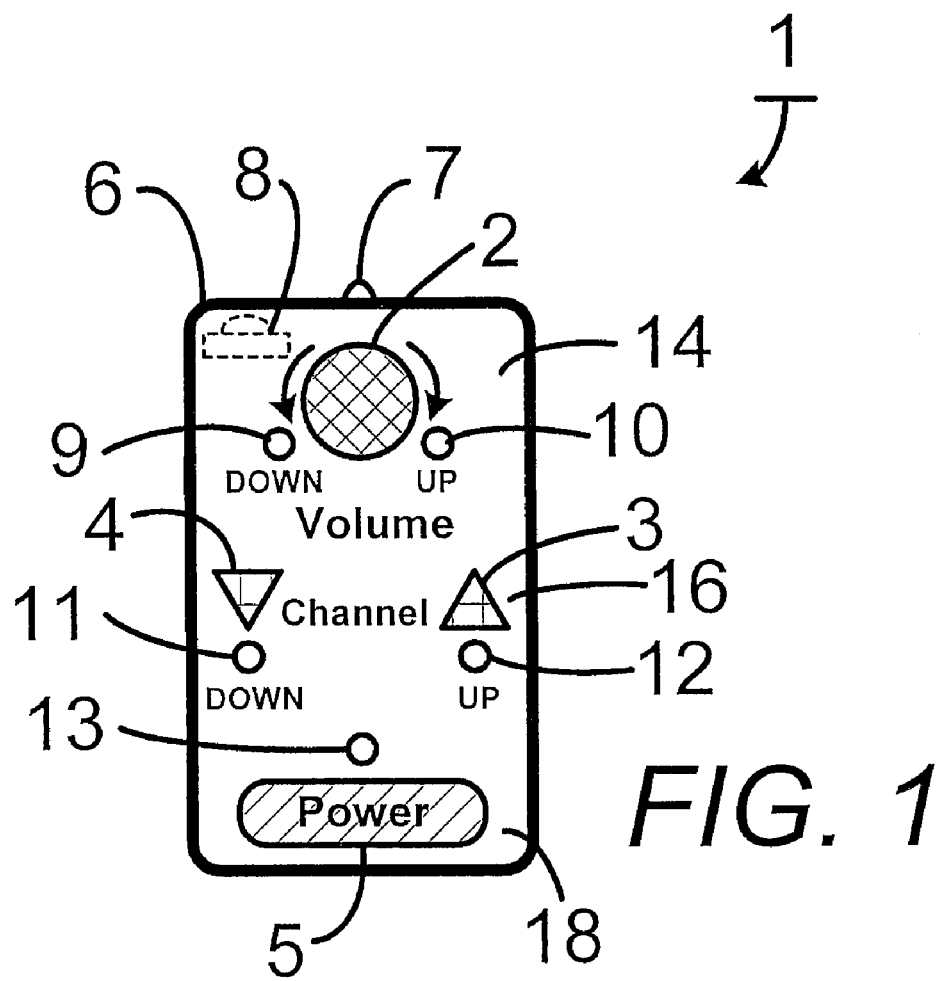
FIG. 1 is a top view of an embodiment of a simplified remote control apparatus of the present invention.

It will be readily understood that the components of the embodiments as generally described and illustrated in the drawings herein, could be arranged and designed in a wide variety of different configurations. Thus, the following more detailed description of the embodiments of the system, components and method of the present invention, as represented in the drawings, is not intended to limit the scope of the invention, as claimed, but is merely representative of the embodiments of the invention.

For appliance users who wish to trade numerous, complex and confusing control options for simplicity and ease of use, an embodiment of a simplified appliance remote control apparatus is provided to help simplify the control of an appliance. The number of control choices is reduced greatly, allowing easier identification of the various controls on the remote. The purpose for each of the controls is readily apparent from the control's appearance and method of using the control. The control appearances of the embodiment of the remote control apparatus are differentiated by function, to make it easier to operate a control, as well as helping to differentiate a particular control from the other control choices. The controls of an embodiment are presented in an intuitive and easy to use manner already familiar to many, if not all, users. To be useful to the greatest number of users, the embodiment of the simplified remote control includes means to operate many, if not all, appliances such as a television set, regardless of brand or model. The embodiment of the remote control apparatus may include a locating mechanism that may aid in finding a "lost" or misplaced remote.

According to one embodiment of the invention, there is provided a remote control apparatus for appliances, such as television sets, radios, computers and others. The apparatus includes a hand held housing, a wireless transmitter for sending signals to the appliance, and a manually operated rotary controller for causing operation adjusting signals to be generated and supplied to the transmitter.

A method and system are disclosed, and may include a remote control apparatus for controlling an electronic appliance. The remote control apparatus may include a housing having a face capable of being divided into three substantially equally sized sections, the three sections being a top section, a middle section, and a lower section; a volume control device being of a first type and located within one of the three sections; and a channel control device being of a second type and located within another of the three sections. The first type and the second type are different.

In accordance with another disclosed embodiment of the invention, there is provided a remote control apparatus, which may include a simplified remote control portion and a standard remote control portion. The simplified remote control portion includes a face capable of being divided into three substantially equally sized sections, the three sections being a top section, a middle section, and a lower section; a volume control device being of a first type and located within one of the three sections; and a channel control device being of a second type and located within another of the three sections. The first type and the second type are different.

According to another aspect of a disclosed embodiment of the invention, there is provided a remote control apparatus for controlling an electronic appliance, comprising a removable simplified remote control portion.

In accordance with yet another disclosed embodiment of the invention, there is provided a method of remotely controlling an electronic appliance. The method may include providing a remote control apparatus having five or fewer controls; programming the remote control apparatus to only be capable of volume control, channel control, and power control of the electronic appliance; and utilizing the remote control apparatus to control the electronic appliance.

Referring to FIG. 1, an embodiment of the present invention as a simplified remote control for controlling an electronic appliance is shown. The simplified remote control 1 may include a hand held housing 6 containing a manually adjustable rotary controller 2 for adjusting the operation of the appliance. For example, the volume of the electronic appliance may be adjusted. Also included is a pair of pushbutton switches 3 and 4 for controlling the appliance such as channel or station selection of the electronic appliance, an elongated pushbutton 5 for controlling the power of the electronic appliance, and a wireless transmitter in the form of an infrared (IR) light emitting diode (LED) 7 for transmitting signals to the electronic appliance for controlling it. The simplified remote control 1 may further include a receiver module 8 for receiving signals sent by another remote control device, and plurality of LED's 9-13 associated with each of the functions of the simplified remote control 1; decrease volume, increase volume, decrease channel, increase channel, and power on/off; respectively.

The housing 6 may be divided into three substantially equally sized sections: a top section 14, a middle section 16, and a lower section 18. For ease of operation the rotary controller 2 may be located in top section 14, the channel selection pushbuttons 3 and 4 in middle section 16, and the power pushbutton 5 in the lower section 18. This separation between the functions may make it much easier to distinguish between the functions and also to correctly select a desired function.

The objectives of this invention may be met by the combination of the following elements as shown in the simplified remote control 1 described above:

1. The remote control 1 may contain only a small subset of control functions found on typical remote controls, namely volume 2, channel selection 3 and 4, and power 5. This limited control set may make the control choices easier to locate and to activate.
2. The three control groups comprising volume, channel selection and power may have different shapes and colors, and may be widely separated to allow easy identification and operation.
3. While the power and channel up/down functions may be controlled using pushbuttons, the volume control may be a rotating controller, which is familiar and intuitive to anyone as a means to raise and lower the volume of an appliance.
4. Receiver module 8, which may be an infra-red receiver or detector, may allow the simplified remote control unit 1 to intercept the IR signals from any remote control for the purpose of receiving the waveforms corresponding to the five control functions, storing the waveforms, and later sending replicas of these waveforms over the infrared Light Emitting Diode (LED) 7 when the corresponding controls 2-5 are activated.
5. The individual controls 3, 4, 5 and/or the case 6, which may be translucent, may be illuminated with light sources that are pulsed on a periodic basis to aid in locating the remote control. LED's 9, 10, 11, 12 and 13 are shown as an example of visible light sources that may be built into the unit. In addition, a translucent case may be illuminated by one or more LED light sources. For example, after a period of one hour during which none of the controls 2-5 is activated, the remote may automatically enter a sleep mode in which it pulses the illumination sources on a very low duty-cycle basis, for example, for 0.5 second every 5 seconds. The low duty cycle may conserve battery power. Activating any of the controls 2-5 may then de-activate the automatic illumination pulsing and revert to normal operation. LEDS 9-13 may also serve to simplify the "learn" mode in embodiments of the invention which use the second mode (beaming the IR signal from an existing remote control into the simplified remote control) as will be further described.

Although the "Volume Up" and "Volume Down" functions may be implemented as additional pushbuttons (as on existing remote controls), the inventive aspect of the rotating controller may be that in addition to providing a common and well known method for adjusting volume, it may also separate the volume adjustment function from the other functions by providing a different means to operate the control as compared to the other controls. The operator may change channels by pressing buttons, but may adjust the volume by rotating a knob. Providing different modalities for different adjustment functions may simplify locating and operating the control groups. Indeed, a remote, such as the one in FIG. 1, may be operated in a dark room, since the rotary controller and the pushbuttons have different tactile feels and modes of adjustment. For example, the volume knob may be easily located in the dark or by a blind person, since it may be the only control that protrudes above the top surface of the remote control, and it may be the only control that rotates.

Figure 6:
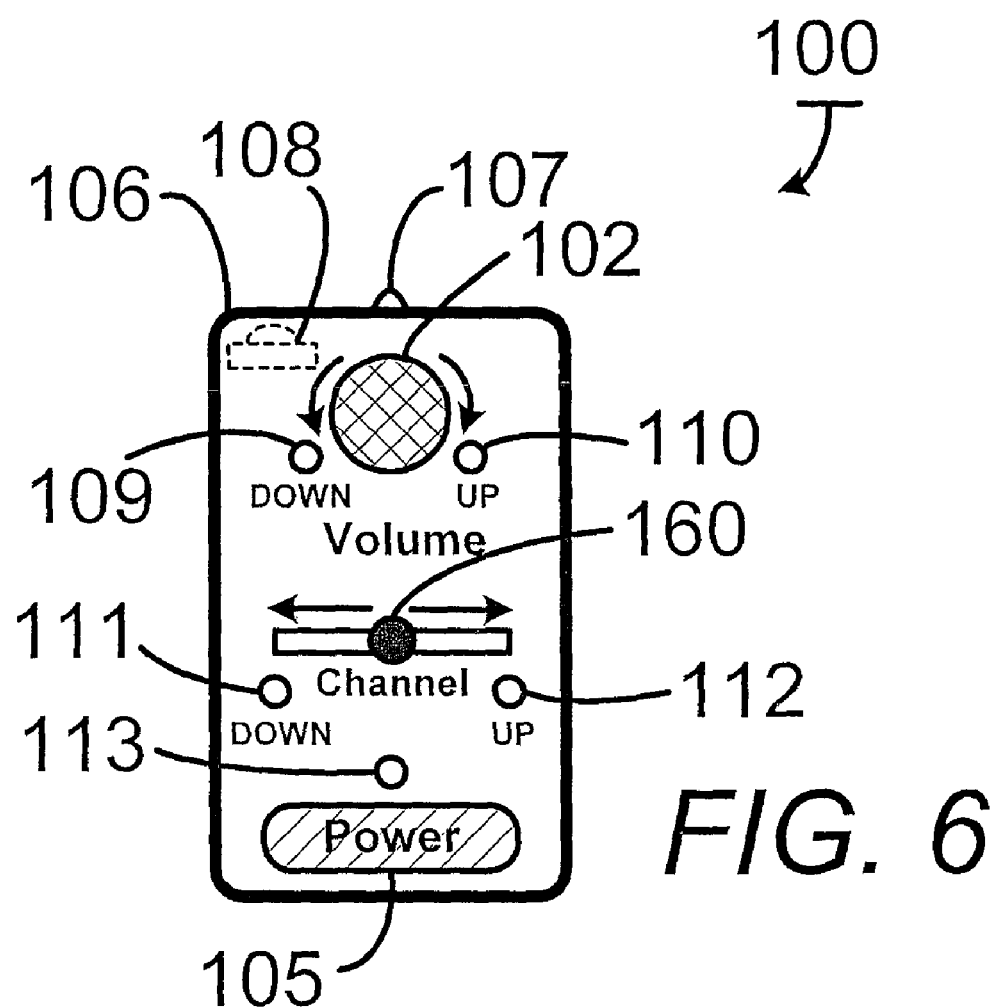
FIG. 6 is a top view of another embodiment of the simplified remote control apparatus, wherein the Channel Up and Channel Down buttons of the apparatus of FIG. 1 are replaced by a two-way lever control.

Although certain inventive concepts are demonstrated by FIG. 1, the figure is not intended to represent the only way to accomplish the objectives of the invention. For example, channel pushbuttons 3 and 4 may be replaced with a lever switch centered in a neutral position, and which may be moved right or left for the "channel up" and "channel down" function, respectively. This variation is illustrated in FIG. 6, where pushbuttons 3 and 4 in FIG. 1 are replaced by a control 160, a center-sprung lever switch that may be momentarily moved to the right or left positions to indicate "Channel Up" or "Channel Down". A concept demonstrated by FIGS. 1 and 6 is that the control groups may be different in appearance and in the case of the volume control, different in adjustment means. The inventive concepts may apply to any controllable device, not limited to a television set.

Figure 2:
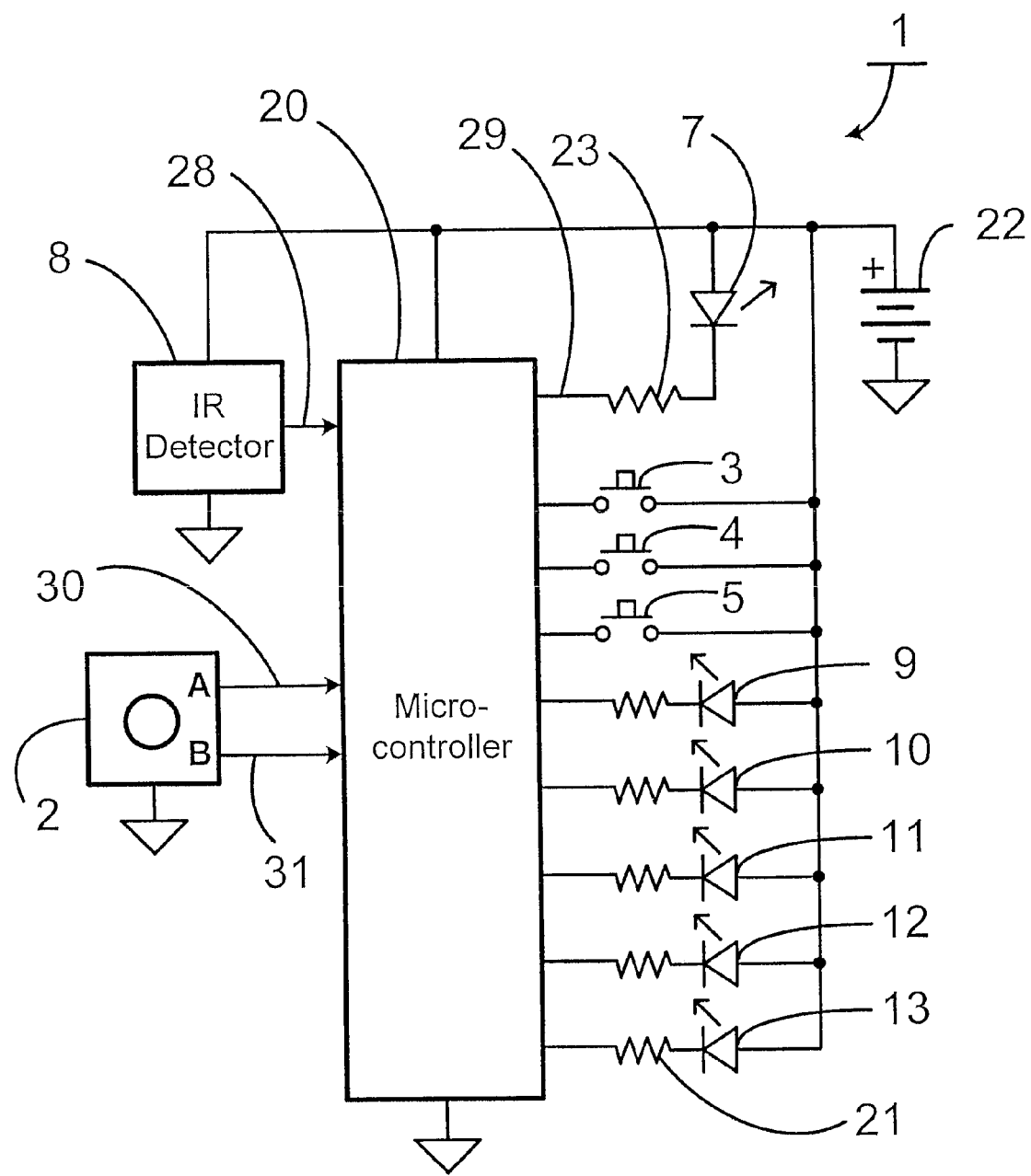
FIG. 2 is a schematic diagram of the simplified remote control device of FIG. 1.

Referring now to FIG. 2, a schematic diagram of the simplified remote control 1 is shown. A microcontroller 20 may be utilized to receive signals from the rotary controller 2 via lines 30 and 31 and from the pushbuttons 3, 4, and 5, and to transmit signals to the IR LED 7 through a current limiting resistor 23 via line 29 in response to signals received from the rotary controller 2 and the pushbuttons 3, 4, and 5. The microcontroller 20 may further receive signals from IR detector 8 via line 28 when learning the control signals of another remote control and transmit signals to the LED's 9-13 through current limiting resistors, such as resistor 21 for the LED 13, to light the LED's individually and/or in combination for a variety of uses of the simplified remote control 1.

The microcontroller 20 may store a program which may conduct the learning function, store parameters reflecting the received infra-red waveforms or control codes, and send out replicas of the learned waveforms or control codes when the user activates the controls 2, 3, 4 and 5. The microcontroller 20 may be chosen from many low-cost microcontrollers. One example is the Atmel AtTiny84, which has 8 Kilobytes of flash program memory and 512 bytes of electrically erasable programmable read-only memory (EEPROM). In general, the microcontroller 20 may need an internal program memory to store the program code, and nonvolatile memory to save the learned IR waveforms or control codes. The nonvolatile memory may be implemented internally as EEPROM such as in the Atmel AtTiny84, or externally by using a low cost EEPROM connected to the microcontroller, Control codes for a single electronic appliance or for a plurality of electronic appliances may be stored in the nonvolatile memory.

The IR detector 8 may receive IR waveforms from the television remote control supplied with the television set that is to be controlled by the inventive device. The output of the IR detector 8 may connect to an input pin of the microcontroller 20 via line 28. Many IR detectors are available, for example, the Honeywell SDP8304 "Optoschmitt Detector with Open-Collector Output". The Honeywell unit may contain an IR detector, amplifier and output driver, making it directly compatible with any microcontroller 20. LED 7 may be an infrared (IR) LED, and resistor 23 may limit the current through the IR LED 7. The microcontroller program may drive the IR LED 7 with waveforms via line 29 that correspond to activation of the particular controls. For example, when the user presses the "Channel Up" button, the microcontroller 20 may send out the particular drive signal via line 29 to IR LED 7 that causes the television set to advance the channel.

The rotary controller 2 may be a digital rotary encoder, for example a Panasonic EVE-VCGJL016B. This continuous rotation encoder may have two switch outputs "A" and "B" connected to the microcontroller 20 via lines 30 and 31, respectively, which represent phased pulse outputs when the shaft is rotated. The signals from the A and B outputs may be interpreted as clockwise and counterclockwise movement of the rotary controller 2

The battery 22 may power the simplified remote control apparatus 1. In the spirit of simplicity, the simplified remote control apparatus 1 may not possess a power switch. The unit may always be on, preventing any confusion caused by inadvertently switching it off. The microcontroller 20 may have a "sleep" mode, consuming typically under 1 microampere, that may be entered when there is no required activity. The sleep mode may be automatically exited using an internal microcontroller interrupt when any control is activated, or when a low power internal timer indicates it is time to blink the locating light or lights.

The visible light LEDS 9-13 may be driven by microcontroller 20 through current limiting resistors, for example resistor 21. These LEDS may implement the "beacon" function previously described wherein the remote blinks lights after a period of inactivity to serve as an aid to locate the remote control. Although five visible LEDS are shown in FIG. 2, there may be any number depending on the physical design of the simplified remote control apparatus 1. Additionally, by positioning the LEDS 9-13 adjacent to the various controls, the learning function may be simplified as described below.

The following are three methods to "teach" a remote control to mimic the functions of another:

1. Put the remote into "learn" mode, then key in a sequence of numbers from the remote control's keypad to select one signal set from an internally stored database of signal sets corresponding to various television sets. Such learning remotes are provided with a document relating various television manufacturer and models to numeric codes to be keyed into the remote for the remote to mimic the particular television. For example, a Sony Model XYZ may require putting the remote into "learn" mode, and then keying in the numeric sequence "12354". The prior-art simplified remote controls cited above use this method.
2. Put the remote into "learn" mode, then arrange the existing television remote such that its transmitter beams into the learning remote, which has a receiver. Then by pressing the keys to be learned on the television remote, the actual signals are sent from the television remote to the learning remote and thus the "codes" are transmitted to the learning remote one key at a time.
3. Provide a computer connection (e.g. USB, Universal Serial Bus) to a personal computer, and "download" codes from a manufacturers' web site.

Any of these methods may be used to adapt the simplified remote control to any particular television set. Method 2 may be the preferred method and is taught by U.S. Pat. No. 4,623,887 to Welles, II which issued on Nov. 18, 1986. However, the other methods may be utilized for some embodiments of the simplified remote control.

In an embodiment of the simplified remote control that mimics the control signals of an existing remote control, there may be a "learning" mode by which the simplified remote control may receive IR signals from the existing remote control. To simplify a learning mode, a sequence may be defined such as the following for the simplified remote control 1 shown in FIG. 1:

1. Arrange the remote control to be learned (the one supplied with the television set) so that it beams its IR signal into IR detector 8. This may be done by putting both remotes on a table and facing them toward each other.
2. Enter the learning mode on the simplified remote control by simultaneously pressing the Channel Down pushbutton 4 and Channel Up pushbutton 3. However, other buttons may be used to initiate the learning mode.
3. The LED 9 may blink to indicate that the unit is ready to receiver the IR signal from the television remote corresponding to the "Volume Down" button. The user may press the "Volume Down" button on the television remote control and hold it down until the LED 9 stops blinking.
4. In a like manner, the LED 10 may blink to prompt the user to press the television remote "Volume Up" button, the LED 11 for the "Channel Down" button, the LED 12 for the "Channel Up" button, and finally the LED 13 for the "Power" button. After the LED 13 extinguishes the learning mode may terminate, and the simplified remote control 1 may be used in place of the original television remote control.

As stated above other methods or sequences may be utilized to teach the simplified remote control the signals of an existing remote control used to control an electronic appliance.

A specific-purpose embodiment of the simplified remote control may also be fabricated to contain only the codes necessary to control a specific television set or other appliance. Such a specific-purpose simplified remote control may have the advantage of lower cost, since the remote may not require additional resources (such as an IR receiver) required to adapt it to a particular appliance. It may also be the simplest to operate since a procedure to adapt it to a particular appliance is not required.

Once the simplified remote control contains the set of IR signals that constitute its reduced functions, the user may operate it in an intuitive manner. The Power, Channel Up and Channel Down buttons may operate exactly as those on the television remote control. Pressing pushbutton 3, 4 or 5 may cause the microcontroller 20 to send the series of pulses required for the appropriate operation by driving IR LED 7 with the required waveform. When the operator turns the rotary controller 2 one increment to the left, the microcontroller 20 may send out one "Volume Down" signal, as if a "Volume Down" button had been pressed. When the operator turns the rotary controller 2 one increment to the right, the microcontroller 20 may send out one "Volume Up" signal, as if a "Volume Up" button had been pressed. Rotating the controller 2 through multiple increments may cause the microcontroller 20 to send a series of "up" or "down" commands, thereby emulating the function of a conventional volume control.

Figure 3:
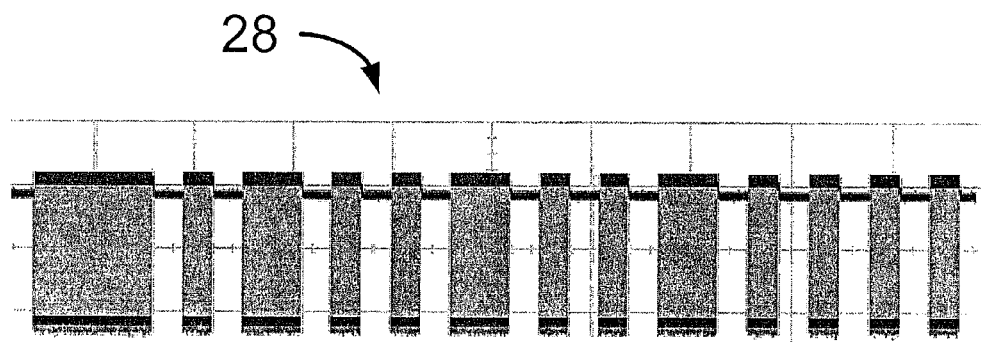
FIG. 3 is a diagram of an oscilloscope measurement representing a typical television IR remote control waveform captured by the IR receiver in the simplified remote control apparatus of FIG. 1.

FIG. 3 shows an oscilloscope measurement of a portion of the signal at line 28 in FIG. 2 when a Sony television remote control unit is pointed into the IR receiver 8, and the "Volume Up" button is pressed on the remote control. (For this specific Sony remote control this pattern actually is sent three times.) The IR LED in the Sony remote control emits a series of pulses, modulated by a 38 KHz square-wave. The horizontal scale in FIG. 3 is 2 milliseconds per division. This distinctive pattern is unique to the "Volume Up" button. In its learning mode, the microcontroller 20 may receive this signal via IR detector 8, and the microcontroller may store a representation of this pattern its non-volatile memory.

Figure 4:
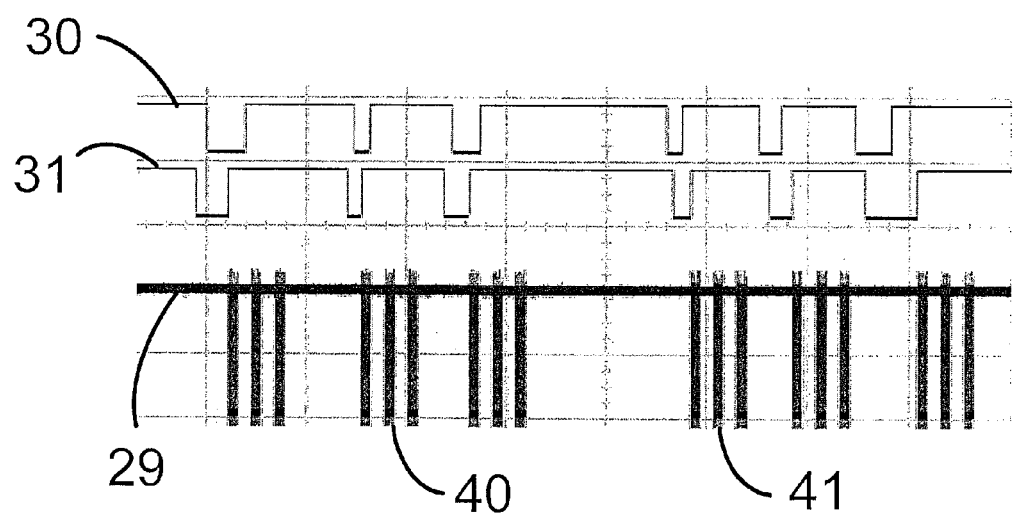
FIG. 4 is a diagram of an oscilloscope measurement showing the relationship between turning a rotary control clockwise and counter-clockwise and the series of IR pulses emitted by the simplified remote control device of FIG. 1 to represent the "volume up" and "volume down" functions, respectively.

FIG. 4 shows how the invention translates rotary control activation into IR LED drive signals that duplicate (mimic) the IR signals emitted by the Sony remote control when its "Volume Up" and "Volume Down" buttons are pressed. The rotary control signals on lines 30 and 31 may indicate a pulse for every "click" of the rotary control, and the relative phases of the signals on lines 30 and 31 may indicate the direction the control is turning. The signal on line 31 may make a low-to-high transition for every click, and the value of the signal on line 30 when this low-high transition occurs may indicate direction. If the signal on line 30 is low during the low-high transition of the signal on line 31, the click may be clockwise. Conversely, if the signal on line 30 is high during the low-high transition of the signal on line 31, the click may be clockwise. Therefore, the first series of three clicks may represent "volume up" (clockwise), and the second series of three clicks may represent "volume down" (counterclockwise). The waveform 29 may be the result of microcontroller 20 recognizing the six clicks, first three clockwise, and then three counter-clockwise, and driving LED 7 with the stored waveforms for volume-up and volume-down. The pattern shown in FIG. 3 may be sent three times for each control increment because this is characteristic of the captured IR waveform from the Sony remote control.

Figure 5:
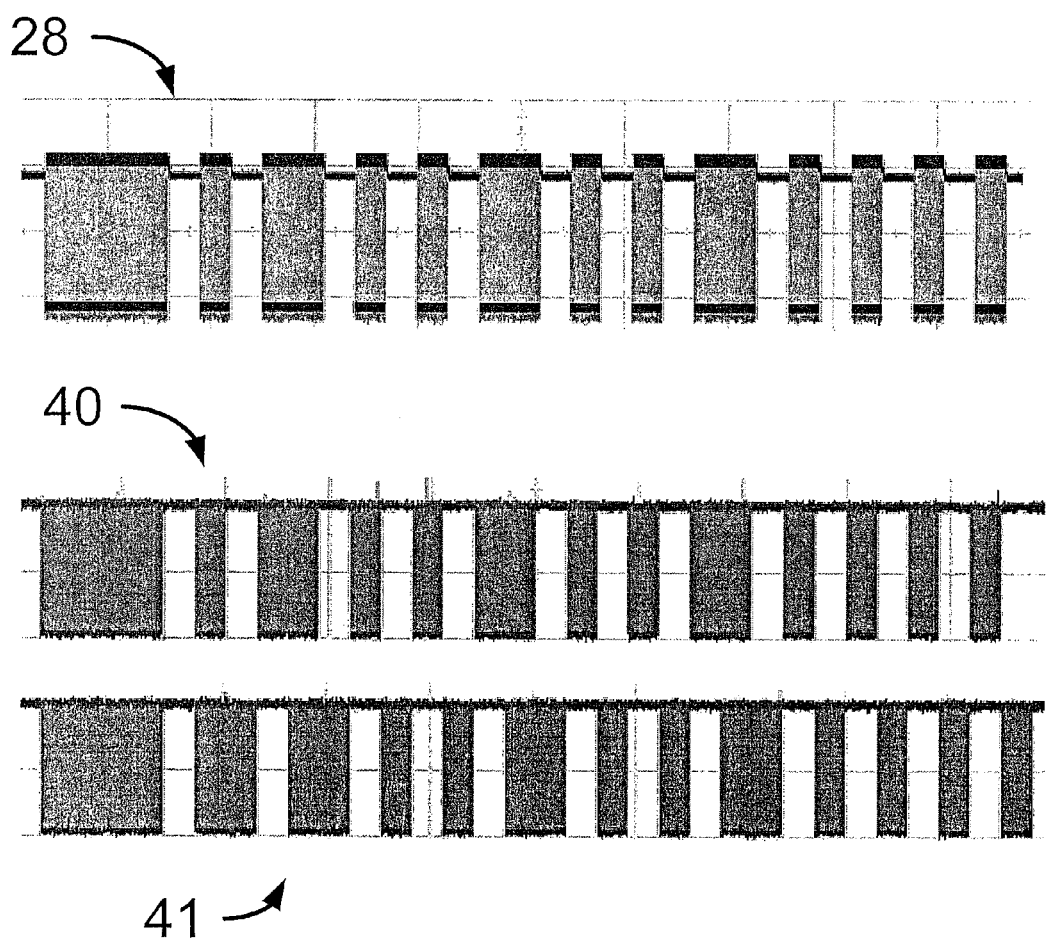
FIG. 5 is a diagram of an expanded view of the series of pulses that mimic "volume up" and "volume down", with the waveform of FIG. 3 repeated to show the correspondence of the captured waveform and the identical copy sent out by the invention.

The waveforms 40 and 41 are expanded in FIG. 5. Also, the captured IR waveform 28 for the Sony remote control "Volume Up" button is shown for reference. It can be seen that when the rotary control moves clockwise, the waveform 40 emitted by microcontroller 20 using its IR LED 7 may duplicate the previously-captured waveform 28. It is also evident that microcontroller 20 may emit a different IR waveform 41 when the rotary control is turned counter-clockwise. In this way a rotary control may exactly duplicate the function of "Volume Up" and "Volume Down" pushbuttons, but in a more natural and intuitive manner for changing the volume of an appliance.

Referring now to FIG. 6, another embodiment of the present invention as a simplified remote control for controlling an electronic appliance is shown. The simplified remote control 100 may include a housing 106 containing a rotary controller 102 for controlling the volume of the electronic appliance, a lever switch 160 for selecting the channel of the electronic appliance, an elongated pushbutton 105 for controlling the power of the electronic appliance, and an infrared (IR) light emitting diode (LED) 107 for transmitting signals to the electronic appliance. The simplified remote control 100 may further include a receiver module 108 for receiving signals sent by another remote control device, and plurality of LED's 109-113 associated with each of the functions of the simplified remote control 100; decrease volume, increase volume, decrease channel, increase channel, and power on/off; respectively. The simplified remote control 100 may function and operate in a substantially identical manner as simplified remote control 1, except that the lever switch may be pushed to the left to go down a channel and pushed right to go up a channel, instead of pressing pushbuttons 4 and 3, respectively.

Figure 7:
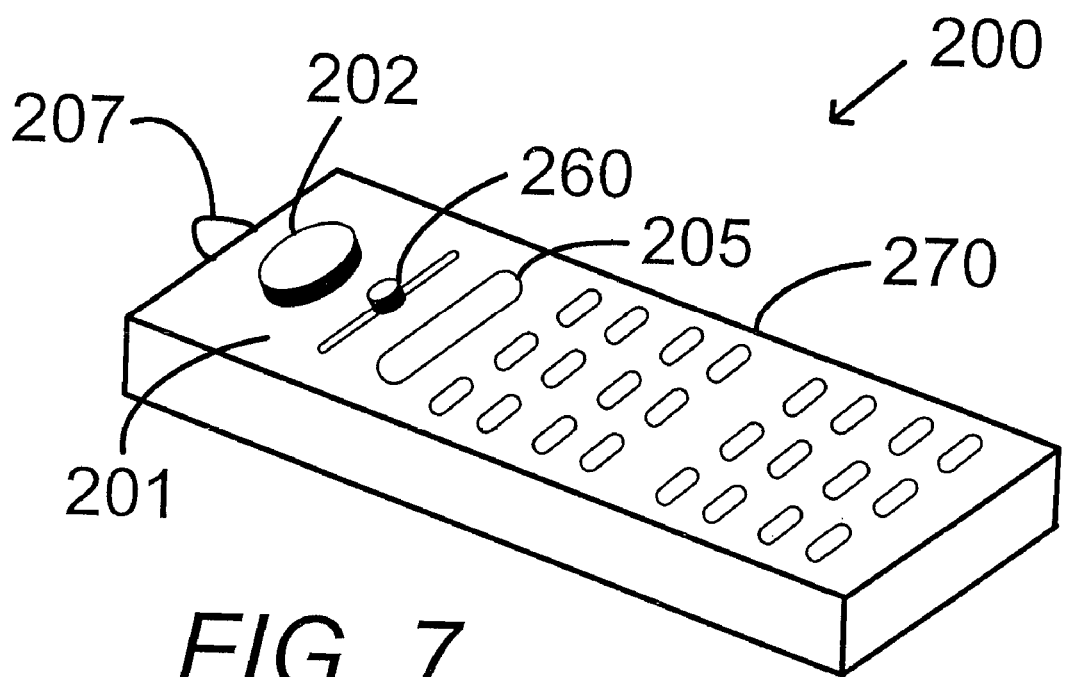
FIG. 7 is a perspective view of still another embodiment of the invention where the simplified remote control apparatus is incorporated as part of a standard, full-function remote control.

Referring now to FIG. 7, an embodiment of the invention where the simplified remote control portion may be added to a standard full function remote control is shown. A full function remote control 200 may include a simplified remote control portion 201 and a standard remote control portion 270. The simplified remote control portion 201 may include a rotary volume controller 202, a channel select lever switch 260, a power pushbutton 205, and an IR LED 207 in a similar manner as described above regarding simplified remote control 100. The user may elect to use only the simplified controls 202, 205, and 260 on the simplified remote control portion 201 of the full function remote control 200, or also to use the remaining buttons on the standard remote control portion 270 to provide more advanced control.

Figure 8:
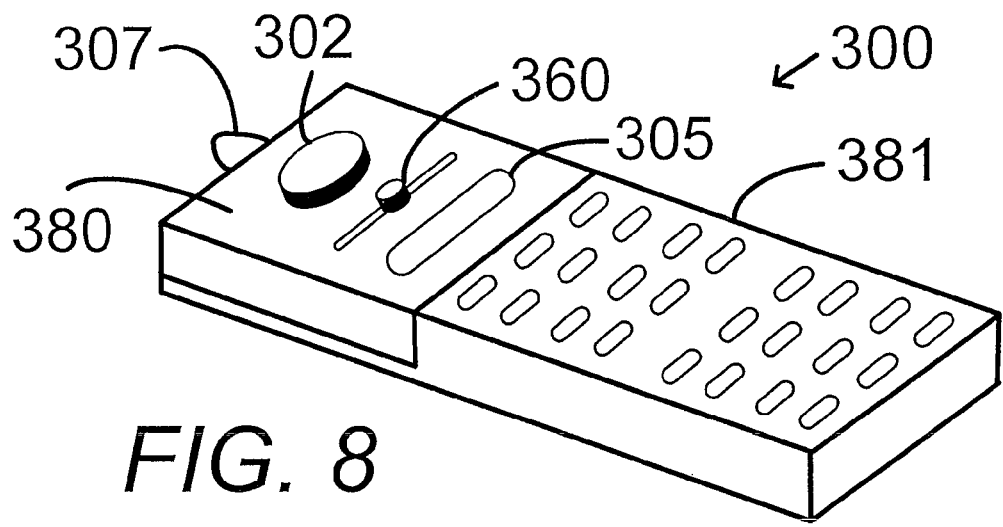
FIG. 8 is a perspective view of another embodiment of the invention similar to the device of FIG. 7, where the simplified remote control apparatus may be detached from the more complex remote control.
Figure 9:
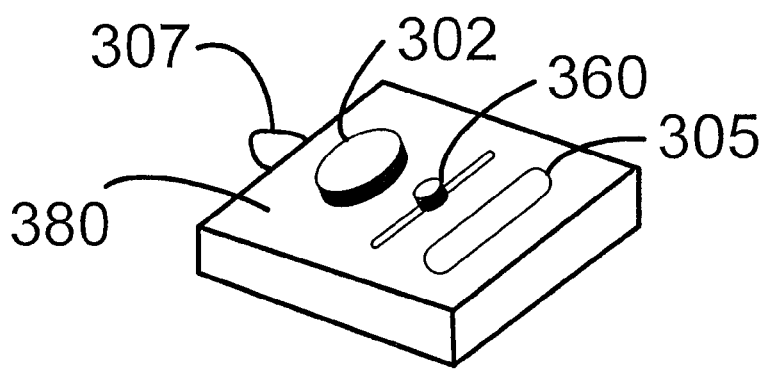
FIG. 9 is a perspective view of the simplified remote control apparatus of FIG. 8 removed from the standard, full-functioned remote control.

Referring now to FIGS. 8 and 9, an embodiment of the invention where the simplified remote control portion may be removable from a standard full function remote control. A full function remote control 300 may include a removable simplified remote control portion 380 and a standard remote control portion 381. The removable simplified remote control portion 380 may include a rotary volume controller 302, a channel select lever switch 360, a power pushbutton 305, and an IR LED 307 in a similar manner as described above regarding simplified remote control 100. The user may elect to remove the simplified remote control portion 380 from the full function remote control 300 as shown in FIG. 9 and use the simplified remote control portion 380 as described above. The standard remote control portion 381 may not be useable when the simplified remote control portion is removed. Alternatively, the user may elect to leave the simplified remote control portion 380 attached to the full function remote control 300 and use only the simplified controls 302, 305, and 360 on the simplified remote control portion 380, or also to use the remaining buttons on the standard remote control portion 381 to provide more advanced control.

Figure 10:
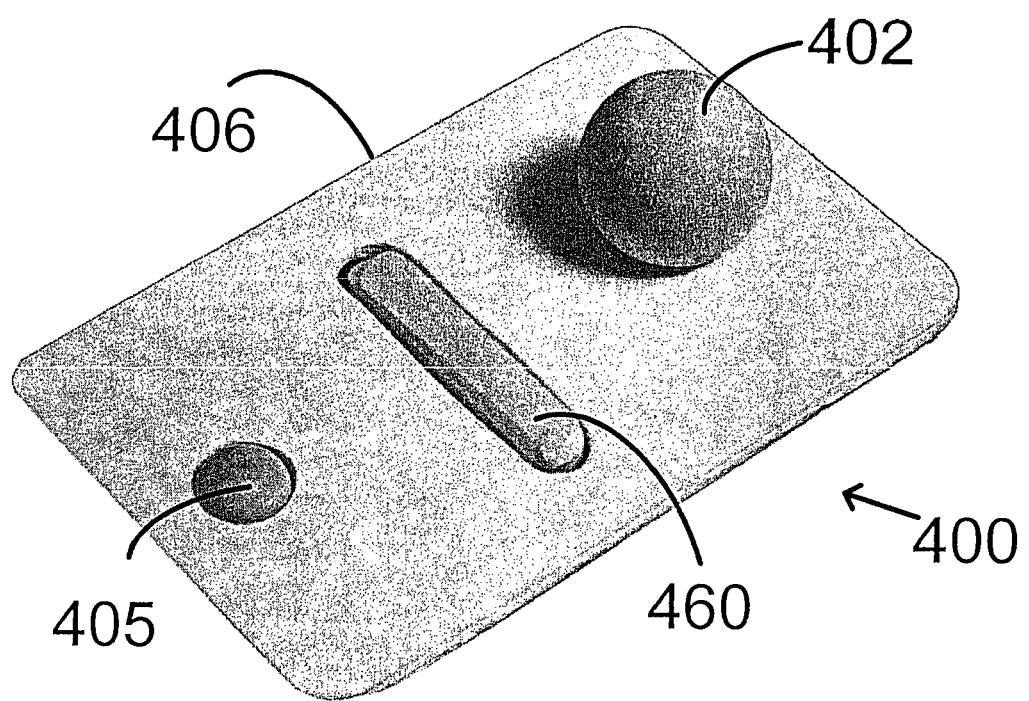
FIG. 10 is a perspective view of yet another embodiment of the simplified remote control apparatus, wherein the Channel Up and Channel Down buttons of the apparatus of FIG. 1 are replaced by a two-way rocker switch.

Referring now to FIG. 10, another embodiment of the present invention as a simplified remote control for controlling an electronic appliance is shown. The simplified remote control 400 may include a generally rectangular shaped housing 406 having a thin thickness. A volume control device 402 is in the form of a rotary controller 402 for controlling the volume of the electronic appliance. The large generally spherical shaped volume control device 402 is rotatable mounted on and protruding from the face of the housing 406, and has a diameter being substantially greater than the thickness of the housing 406 to enable the volume control device to be readily located by the user. A channel control device 460 is in the form of a rocker switch 460 for selecting the channel of the electronic appliance. The elongated generally rectangular channel control device extends across the face of the housing 406 and has a thickness being substantially less than the diameter of the spherical volume control device to distinguish readily the volume and channel control devices by tactile feel by the user. A power control device 405 is in the form of a pushbutton 405 for controlling the power of the electronic appliance. The generally circular shaped power control device 405 has a thickness being substantially less than the diameter of the spherical volume control device 402 to distinguish it readily from the volume and channel control devices by tactile feel by the user. Each one of the three substantially equal size sections confines only an individual one of the three control devices (402, 460, 405) only and no other control device. The simplified remote control 400 may function and operate in a substantially identical manner as simplified remote control 1, except that the left side of the rocker switch may be pushed to go down a channel and the right side pushed to go up a channel, instead of pressing pushbuttons 4 and 3, respectively.

While particular embodiments of the present invention have been disclosed, it is to be understood that various different embodiments are possible and are contemplated within the true spirit and scope of the appended claims. There is no intention, therefore, of limitations to the exact abstract or disclosure herein presented.

What is claimed is:

1. A simplified remote control apparatus for controlling an electronic appliance, comprising
a housing including a face divided into three substantially equally sized sections, the three sections being a top section, a middle section, and a lower section;
a volume control device being of a first type and located within one of the three sections; and
a channel control device being of a second type and located within another one of the three sections,
a power control device for controlling the power to the remote control apparatus, the power control device being of a third type and located within a further one of the three sections;
the housing being generally rectangular in shape and having a thin thickness;
the volume control device having a large generally spherical shape rotatably mounted on and protruding from the face of the housing and having a diameter being substantially greater than the thickness of the housing to enable the volume control device to be readily located manually by the user;
the channel control device being elongated generally rectangular in shape and being a rocker switch having one side for going up a channel and the other side for going down a channel;
the channel control device extending across the face of the housing and having a thickness being substantially less than the diameter of the spherical volume control device to distinguish readily the volume and channel control devices by tactile feel by the user;
the power control device being generally circular in shape and being a pushbutton, the power control device having a thickness being substantially less than the diameter of the spherical volume control device to distinguish it readily from the volume and channel control devices by tactile feel by the user;
wherein each one of the three substantially equal size sections confines only an individual one of the three control devices only and no other control device; and
wherein the first type, the second type, and the third type are different.

2. The apparatus of claim 1, wherein the first type includes a rotary controller.

3. The apparatus of claim 1, wherein the second type includes a rocker switch.

4. The apparatus of claim 1, wherein the volume control device is located in the top section and the channel control device is located in the middle section.

5. The apparatus of claim 4, further including a power control pushbutton located in the bottom section.

6. A method of remotely controlling an electronic appliance, comprising
providing a remote control apparatus having a plurality of control devices according to claim 1;

programming the remote control apparatus for volume control, channel control, and power control only for the electronic appliance; and utilizing the remote control apparatus to control the electronic appliance.

7. The method of claim 6, wherein the programming includes providing a set of control codes to the remote control apparatus.

8. The method of claim 6, wherein the programming includes receiving waveforms from a specific remote controller.

9. A remote control apparatus for controlling an electronic appliance, comprising a housing including a simplified remote control portion and a standard remote control portion; and the simplified remote control portion including:

the house having a face divided into three substantially equally sized sections, the three sections being a top section, a middle section, and a lower section;

a volume control device being of a first type and located within one of the three sections; and a channel control device being of a second type and located within another of the three sections, a power control device for controlling the power to the remote control apparatus, the power control device being of a third type and located within a further one of the three sections;

the housing being generally rectangular in shape and having a thin thickness;

the volume control device having a large generally spherical shape rotatably mounted on and protruding from the face of the housing and having a diameter being substantially greater than the thickness of the housing to enable the volume control device to be readily located manually by the user;

the channel control device being elongated generally rectangular in shape and being a rocker switch having one side for going up a channel and the other side for going down a channel;

the channel control device extending across the face of the housing and having a thickness being substantially less than the diameter of the spherical volume control device to distinguish readily the volume and channel control devices by tactile feel by the user;

the power control device being generally circular in shape and being a pushbutton, the power control device having a thickness being substantially less than the diameter of the spherical volume control device to distinguish it readily from the volume and channel control devices by tactile feel by the user;

wherein each one of the three substantially equal size sections confines only an individual one of the three control devices only and no other control device; and wherein the first type and the second type are different.

10. The apparatus of claim 9, wherein the first type includes a rotary controller.

11. The apparatus of claim 9, wherein the second type includes a rocker switch.

12. The apparatus of claim 9, wherein the volume control device is located in the top section and the channel control device is located in the middle section.

13. The apparatus of claim 9, wherein the simplified remote control portion includes a power control pushbutton located in the bottom section.

\* \* \* \* \*